(12) United States Patent
Smith

(10) Patent No.: US 9,304,986 B1
(45) Date of Patent: Apr. 5, 2016

(54) METHODS AND SYSTEMS TO AUTOMATICALLY CONNECT WITH INTERFACES

(71) Applicant: Altera Corporation, San Jose, CA (US)

(72) Inventor: Kevin Smith, High Wycombe (GB)

(73) Assignee: Altera Corporation, San Jose, CA (US)

( * ) Notice: Subject to any disclaimer, the term of this patent is extended or adjusted under 35 U.S.C. 154(b) by 324 days.

(21) Appl. No.: 13/920,978

(22) Filed: Jun. 18, 2013

(51) Int. Cl.
*G06F 17/50* (2006.01)
*G06F 17/27* (2006.01)

(52) U.S. Cl.
CPC .................. *G06F 17/272* (2013.01)

(58) Field of Classification Search
CPC ..... G06F 13/105; G06F 13/16; G06F 13/385; G06F 17/5045; G06F 3/00; G06F 3/002; G06F 3/038; G06F 15/7867; G06F 2217/14
USPC .................................................. 716/100–136
See application file for complete search history.

(56) References Cited

U.S. PATENT DOCUMENTS 7,149,995 B2 * 12/2006 Raghunandran ............... 716/112
7,331,022 B1 * 2/2008 Pritchard ............ G06F 17/5072
                                                716/126
7,784,046 B2 * 8/2010 Lajolo et al. .................. 717/172

* cited by examiner

*Primary Examiner* — Nghia Doan
(74) *Attorney, Agent, or Firm* — Fletcher Yoder, P.C.

(57) ABSTRACT

Methods and systems to automatically build a native interface for connecting a hardware block to an external component such as a processor or a memory. A description file of the hardware block is parsed to extract a plurality of interface signals. A register map is automatically created, in hardware, based on the extracted interface signals. A wrapper is automatically generated for interfacing with the automatically built register map according to a target interface.

20 Claims, 5 Drawing Sheets

METHODS AND SYSTEMS TO AUTOMATICALLY CONNECT WITH INTERFACES

FIELD OF THE INVENTION

The present disclosure relates to methods and systems for designing and developing electronic devices. More specifically, the present disclosure relates to methods and systems for generating and simulating hardware designs.

BACKGROUND OF THE INVENTION

System design involves creating, developing, and refining electronic designs such as channels, memory, and other structures for implementation in electronic devices. The design process may involve several domains (or phases), including a system level design domain/phase, a logic/DSP design domain/phase, a hardware level design domain/phase and a software level design domain/phase.

System design may be done using system level electronic design automation (EDA) tools that allow a designer to model, simulate, and analyze systems. Some system level EDA tools such as Simulink® from MathWorks® allow designers to create, simulate, evaluate, and refine a system design model through standard and custom block libraries. Users may design and simulate algorithms in Simulink® or other simulator tools by entering logic blocks and associated connections using a graphical user interface. The system level design may then be compiled and evaluated in the logic/DSP domain and/or in the hardware design domain. For example, system characteristics such as noise immunity, error recovery, and power consumption may be evaluated using simulation and complex mathematical analysis software. System characteristics may also be evaluated using hardware testing, by downloading the design into a hardware platform and measuring the system characteristics in the hardware. Block libraries such as DSP Builder from Altera® Corporation provide digital signal processing (DSP) development tools that interface between system level EDA tools (for performing design modeling and analysis) and hardware design flow tools (for performing synthesis, placement, and routing).

Current design flows may limit interoperability with existing designs and/or with simulation models. For example, current system level EDA tools and block libraries may provide limited support for converting designs written in hardware description language (HDL) code to a simulation model having a format compatible with the system level EDA tools. This makes it difficult for users to reuse existing designs written in HDL code, and may decrease robustness and efficiency. Some block libraries impose rules on HDL port declarations where certain signals need to be renamed in order for the block libraries to recognize the signals and make the appropriate connections in the simulation model. In addition, many of these block libraries do not allow a user of the system level EDA tool to select how a simulation model of a design written in HDL code should be represented in the system level environment.

Current design flows may make it difficult to connect designs written in HDL code to other components of the system. In some cases, connecting a system level representation of a hardware block to another component may force the designer to create additional interface-specific blocks. For example, to create an interface between an HDL representation of a hardware block and a processor, users may have to manually define an interface block for each signal of the hardware block so that the processor is able to properly supply input data to the hardware block and/or properly read output data from the hardware block. In addition, users may have to create handshaking logic and/or draw logic schematics to enable coordinated execution between the hardware block and the processor. For example, users may need to manually create software drivers for the processor to communicate with the hardware block generated from the HDL representation. In addition to being tedious, time-consuming, and error-prone, this current approach may be incompatible with the simulation model used in the simulator tools. As a result, design flows may not be supported for running simulation vectors directly from the processor into the generated hardware.

SUMMARY OF THE INVENTION

This disclosure relates to methods and systems for designing and developing electronic devices. More specifically, the present disclosure relates to methods and systems for generating and simulating hardware designs.

In accordance with some embodiments, there are provided systems and methods for connecting a hardware block to another component. A description file of the hardware block is parsed to extract a plurality of interface signals. A register map is automatically built in hardware based on the extracted interface signals. The register map includes an input register configured for supplying an input signal to the hardware block, the input signal matching a first interface signal from the plurality of interface signals. The register map includes an output register configured for receiving an output signal from the hardware block, the output signal matching a second interface signal from the plurality of interface signals. A software driver is automatically generated for interfacing with the automatically built register map according to a target interface.

In accordance with some embodiments, there is provided a register map for connecting a hardware block to another component. The register map includes an input register automatically configured in hardware for supplying an input signal to the hardware block, the input signal matching a first interface signal from a plurality of interface signals, where the plurality of interface signals is extracted from parsing a description file of the hardware block. The register map includes an output register automatically configured in hardware for receiving an output signal from the hardware block, the output signal matching a second interface signal from the plurality of interface signals, where the register map interfaces with a target interface using an automatically generated software driver.

BRIEF DESCRIPTION OF THE DRAWINGS

Further features will be apparent upon consideration of the following detailed description, taken in conjunction with the accompanying drawings, in which like reference characters refer to like parts throughout, and in which.

DETAILED DESCRIPTION OF THE INVENTION

Embodiments will be explained in connection with various specific devices, tools, etc. However, these references are for purposes of illustration only and are not intended to limit the present invention in any way. For example, one or more embodiments will be explained using Altera's DSP Builder and/or MathWorks' Simulink. However, these embodiments are applicable to other builder, simulator, and/or design tools, for example those used in creating high-performance system-on-a-programmable-chip (SOPC). Moreover, one or more embodiments will be explained using specific types of interfaces and programmable logic devices. However, these embodiments may be used with a wide variety of interfaces, IP blocks, and components. For example, embodiments of the present disclosure can be incorporated into designs involving various types of interfaces, processors, peripherals, and switch fabrics. Embodiments of the present disclosure may be incorporated into designs involving various types of integrated circuits, including but not limited to programmable logic devices (PLDs), field programmable gate arrays (FPGAs), and application-specific integrated circuits (ASICs).

Figure 1:
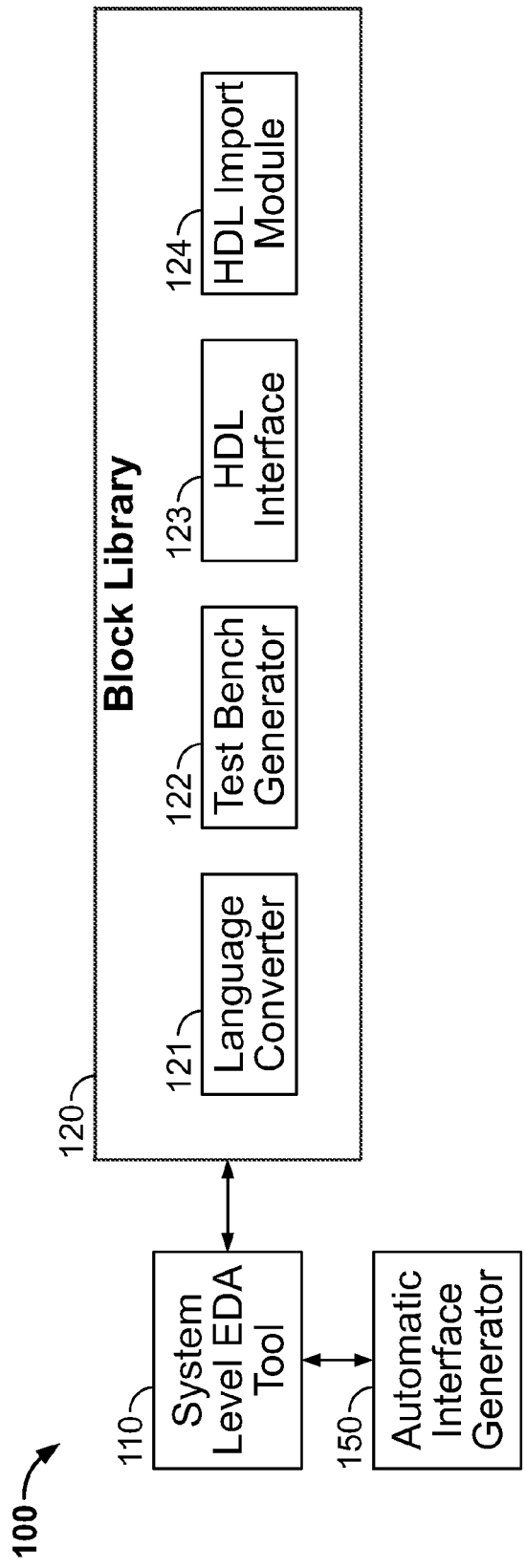
FIG. 1 illustrates a block diagram of a system design tool according to some embodiments.

FIG. 1 illustrates a block diagram of a system design tool 100 according to some embodiments. The system design tool 100 includes a system level EDA tool 110 and a block library 120 which together may be used to create a system design model that reflects an abstract level of design of the system. The system level EDA tool 110 may be a software package that models, simulates, and analyzes dynamic systems having outputs that change over time. The system level EDA tool 110 may provide a graphical user interface for building models as block diagrams. The system level EDA tool 110 may include a library of pre-defined and user-defined blocks that represent general functionalities. The functionalities may include math, logic and bit, communications, signal processing, video and image processing operations. In some embodiments, the system level EDA tool 110 may be implemented by Simulink® from MathWorks®.

The block library 120 is a block set that interfaces with the system level EDA tool 110. The block library 120 may link the system level EDA tool 110 with a hardware design flow tool. The block library 120 may combine algorithm development, simulation, and verification capabilities of the system level EDA tool 110 with HDL synthesis, simulation, and development tools in the hardware design flow tool. The block library 120 may also provide a variety of fixed-point arithmetic and logical operators to be used by the system level EDA tool 110.

The block library 120 includes a language converter 121. The language converter 121 converts code in one language to a second language. According to an embodiment of the block library 120, the language converter 121 converts a design in a system level representation to an HDL representation. In one embodiment, the system level representation may be a MATLAB®/Simulink® model description language (MDL) representation and the HDL representation may be Very High Speed Integrated Circuit (VHSIC) Hardware Description Language (VHDL) or Verilog.

The block library 120 includes a test bench generator 122. The test bench generator 122 generates stimulus files that may be used to run register transfer level (RTL) simulations. The stimulus files may be used to test a design written in HDL code. In some embodiments, the same stimulus used in testing the system level representation is used to test the HDL code.

The block library 120 includes an HDL interface 123. The HDL interface 123 allows the system level EDA tool 110 to utilize functions in other tools. According to one embodiment of the block library 120, the HDL interface 123 generates scripts, such as Tool Command Language (Tcl) scripts, that may be used to access synthesis, placement, and routing functions in a hardware design flow tool.

The block library 120 includes an HDL import module 124. The HDL import module 124 generates a template of a simulation model from a design written in HDL code. The simulation model may be used in system level design by the system level EDA tool 110. According to an embodiment of the block library 120, the template of the simulation model generated by the HDL import module 124 may be represented using one or more selectable options. The template for the simulation model may include a plurality of input and outputs from the design.

The hardware design flow tool may be implemented by Quartus® or Quartus II® by Altera® Corporation, and the block library 120 may be implemented by DSP Builder by Altera® Corporation.

System level EDA tool 110 interacts with automatic interface generator 150 configured for automatically building interfaces to connect hardware blocks. Automatic interface generator 150 may build interfaces in software and/or in hardware to connect hardware blocks to processors, memory devices, or any suitable component. Although the automatic interface generator 150 is shown as a separate block and may be implemented as a standalone component, this is meant for the purpose of illustration not limitation. Automatic interface generator 150 may be part of another block. For example, automatic interface generator 150 may be implemented as a specific component of block library 120. Alternatively, automatic interface generator 150 may be implemented as part of system level EDA tool 110, Automatic interface generator 150 may build any suitable type of desired or target interface, for example, Altera Nios II microprocessor buses including, but not limited to, Avalon Interface, and Latice LatticeMicro32; ARM Microprocessor buses including, but not limited to, Advanced Microcontroller Bus Architecture (AMBA), and Advanced High performance Bus (AHB); Xilinx Microblaze microprocessor buses including, but not limited to, Fast Simplex Link (FSL), On-chip Peripheral Bus (OPB), and Local Memory Bus (LMB); Xilinx PowerPC microprocessor buses including, but not limited to, On-chip Peripheral Bus (OPB), Processor Local Bus (PLB), and Device Control Register (DCR) bus; and open IP microprocessor core buses including, but not limited to, Wishbone.

Figure 2:
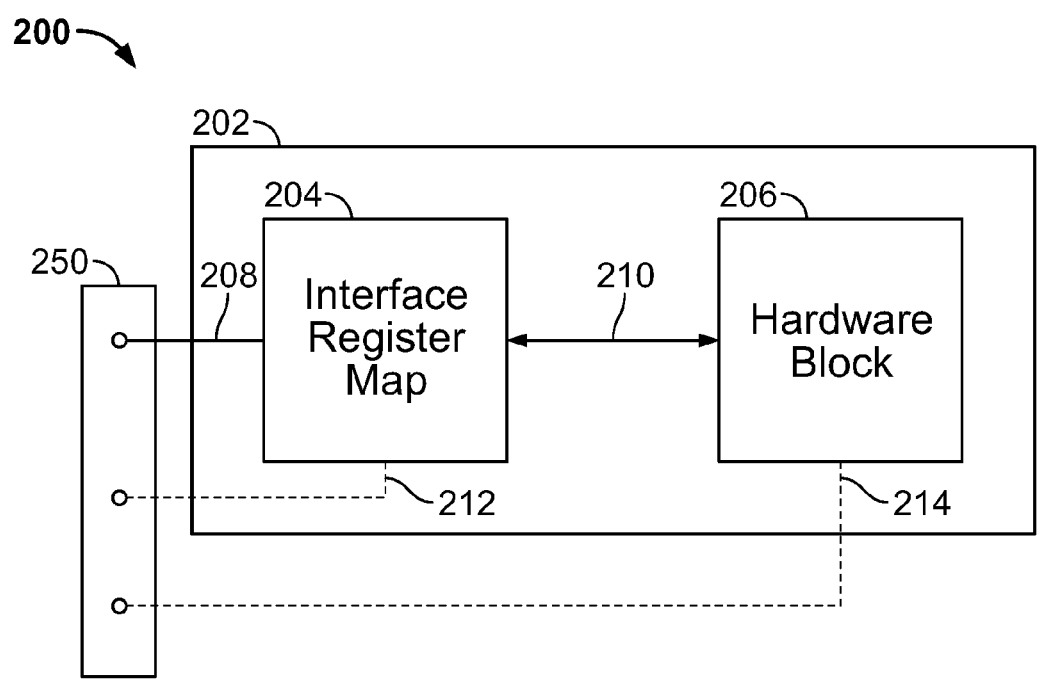
FIG. 2 shows a simplified block diagram of a hardware component connected through an interface according to some embodiments.

FIG. 2 shows a simplified block diagram 200 of a hardware component 202 connected through an interface 250 according to some embodiments. Hardware component 202 may be generated using a hardware design flow tool and may include interface register map 204 and hardware block 206. In some implementations, interface 250 is a standard interface, e.g., an Avalon® interface, an AMBA® AXI3™ interface, or an AMBA AXI4™ interface. For example, these implementations may involve connecting hardware block 206 to an IP core with an Avalon or AXI interface 250. In other implementations, interface 250 may be a non-standard interface corresponding to a set of appropriate specifications. Interface 250 may be connected to any suitable external component, such as a processor, a memory component, an IP core, or any suitable electronic circuit or device.

Figure 5:
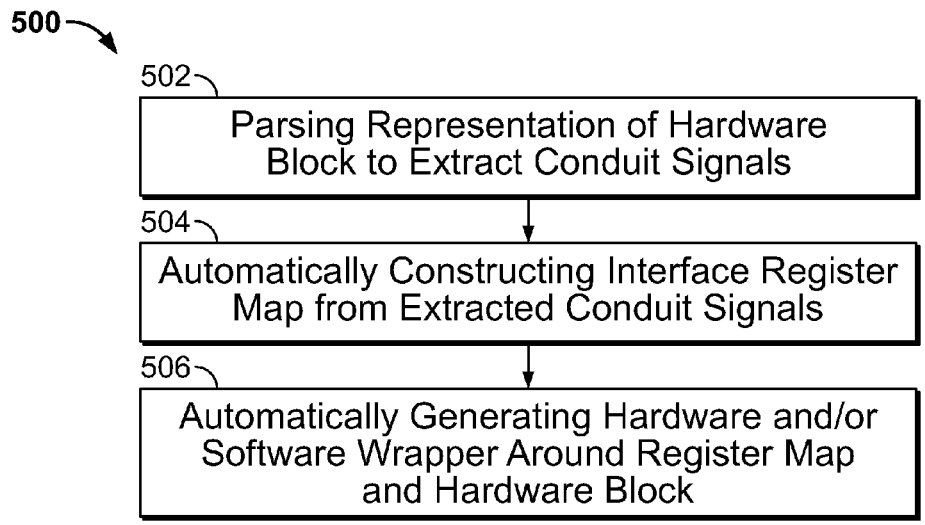
FIG. 5 shows an exemplary flowchart of a process for connecting a hardware block through an interface according to some embodiments.

Details of FIG. 2 will be explained in reference with FIG. 5. FIG. 5 shows an exemplary flowchart of a process 500 for connecting a hardware block through an interface such as interface 250 of FIG. 2. Process 500 may be performed by automatic interface generator 150 of FIG. 1.

At 502, a representation of the hardware block, e.g., block 206 of FIG. 2, is parsed. In some implementations, the representation may be in the form of a hardware component description file "hw.tcl" used to describe and package components in some design tools. The parsing operation may be performed using an automatic interface generator, e.g., similar to automatic interface generator 150 of FIG. 1. The parsing operation at 502 may determine conduit signals corresponding to hardware block 206. Conduit signals herein refer to any type of signal that the hardware block may use to transmit data to, receive data from, and/or otherwise communicate with an external component. The external component may include a memory unit, a processor, and/or an interface. By parsing such representations of the hardware block at 502, process 500 is able to automatically adjust the generated interface to changes in the port list of the hardware block.

Conduit signals may have different types and/or subtypes. A conduit signal may have a predetermined interface role, such as an input signal, an output signal, or a control signal. Alternatively, a conduit signal may not have a predetermined interface role, such as a signal that is specific to a particular type of hardware block. For example, a conduit signal may carry information specific to the type of algorithm implemented by the hardware block. In one illustrative and non-limiting example, hardware block 308 may implement a closed-loop motor control, illustrative inputs may include torque command, electrical current, and position sensor values and illustrative outputs may include voltage command.

The conduit signals extracted from the representation of the hardware component may be filtered into different categories and possibly subcategories based on their associated role. For example, the extracted signals may be filtered into one or more interface function categories, such as an input category, an output category, and/or a control category. Such interface conduit signals are represented in FIG. 2 by signals 210.

An interface function category may be subdivided into subtypes. For example, the input category may itself include a data input subtype for signals that carry input data into the hardware block, a configuration parameter input subtype for signals that provide configuration parameters to the hardware block, and a channel input subtype for signals that identify the channel being input or processed during a given processing period.

The output category may include a data output subtype for signals that carry output data from the hardware block, e.g., as a result of a computation performed by the hardware block. The output category may include a channel output subtype for signals that identify the channel being output during a given processing period.

The control category may include a data-ready signaling category for signals that indicate that hardware block 206 is finished with a previous calculation and/or is ready to receive new data. The control category may include a data-valid signaling category for signals that indicate to hardware block 206 that the data being received is valid and/or that the hardware block is ready to start a new calculation.

In some embodiments, one or more conduit signals may not belong to any of the interface function categories above. Such conduit signals are said to correspond to a custom category. For example, one or more conduit signals may not correspond to any of the input, output, or control categories defined above because these signals may not have an interface specific role. Alternatively, the custom category may include signals that are already compliant with interface specifications and so do not require processing through register map 204. Conduit signals in the custom category may be excluded from the interface register map 204 and may be exported directly outside of hardware block 206. These excluded signals (also referred to as ignored) are represented as signals 214 in FIG. 2.

At 504, the conduit signals from 502 are used to construct an interface register map, such as interface register map 204 of FIG. 2. Interface register map 204 maps from conduit signals 210 to interface-compliant signals 208, i.e., to signals that comply with interface 250. Compliance with an interface herein means that signals 208 have names, labels, types, formats, numbers, and/or any suitable characteristic to make signals 208 conform to specifications of interface 250. The interface register map may have one or more input registers configured for supplying an input signal to the hardware block 206, the input signal matching a first conduit signal from the plurality of conduit signals 210. The interface register map may have one or more output registers configured for receiving an output signal from the hardware block, the output signal matching a second conduit signal from the plurality of conduit signals 210.

In some embodiments, interface 250 may correspond to a slave interface implementation so that hardware block 206 is controlled by an external processor. In this case, handshaking logic may be implemented in the interface register map so that the processor directs the hardware block to start a new computation, and the hardware block signals to the processor when the hardware block is finished with the computation.

In some embodiments, interface 250 may correspond to a master interface implementation. In this case, and in addition to interface-compliant signals 208, one or more interface master signals 212 may be generated. For example, the master interface implementation may autonomously move input and output data between the hardware block and shared memory through signals 212 without being directed to do so by an external processor. Relieving the processor from this task of controlling data movement may improve latency and enhance performance, e.g., in latency sensitive applications.

At 506, a wrapper is automatically generated around register map 204 and hardware block 206 to comply with interface 250. This wrapper may include one or more hardware components. For example, this wrapper may wrap the hardware block 206 and interface register map 204 into a single component 202, and therefore may enable easy software integration. This wrapper may include one or more software components. For example, 506 may include automatically generating prototype C code functions, header files, and/or other types of software drivers for interfacing with the register map created at 504. The software components generated at 506 may facilitate connection of the hardware block to a processor, for example, by allowing the processor to interface with the hardware block through the automatically generated software functions. The generated software components may also initialize the interface and transfer data from and to the interface.

Figure 3:
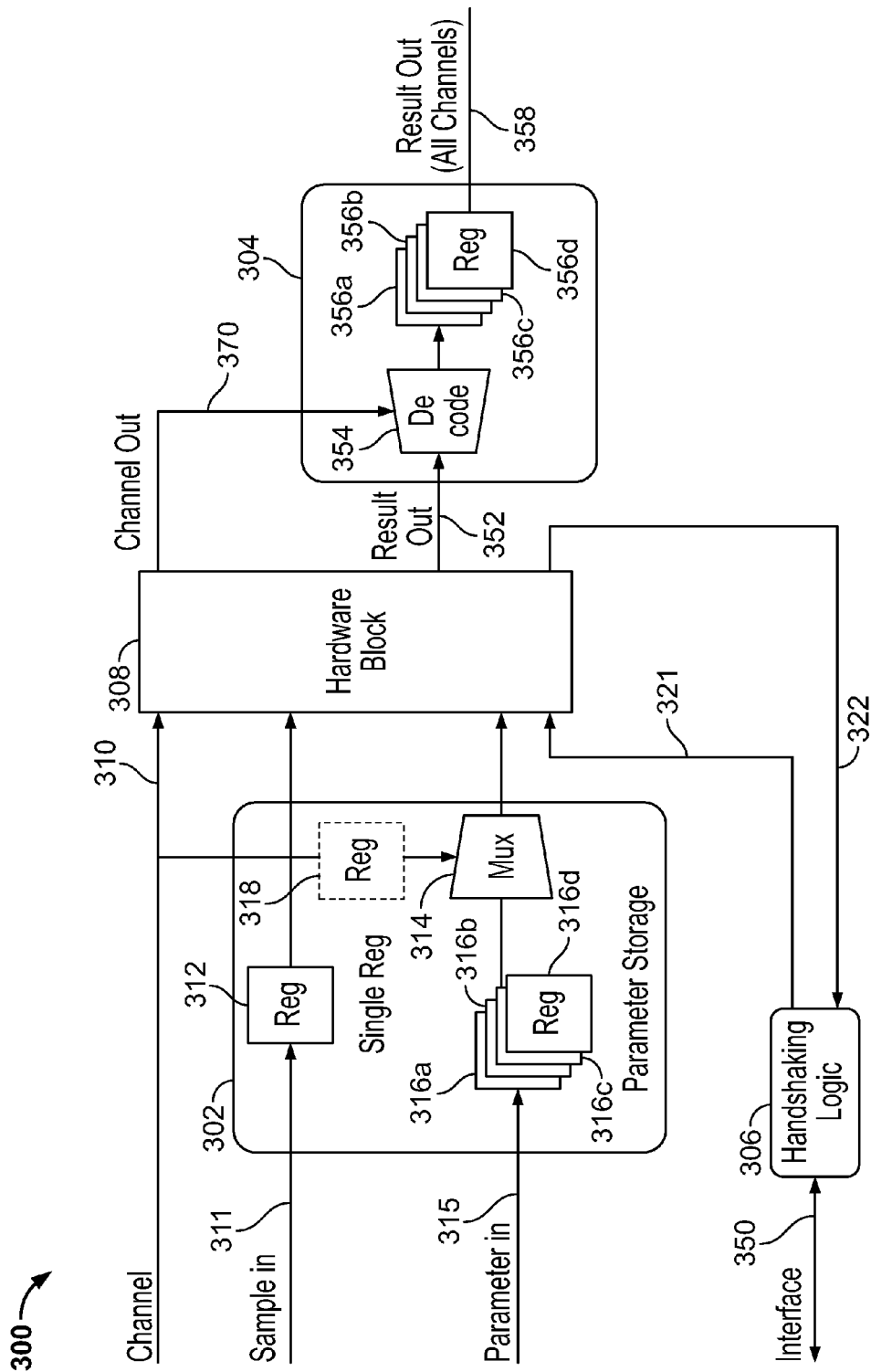
FIG. 3 is a block diagram of a hardware component according to some embodiments.

An illustrative implementation of component 202 is shown in FIG. 3. FIG. 3 is a block diagram of a hardware component 300 according to some embodiments. Hardware component 300 includes a hardware block 308, which may be similar to hardware block 206 of FIG. 2, and may implement any number and type of functions, including but not limited to a DSP engine, a decoder, a processing element, a matrix solver, and a motor control element. Illustrative hardware component 300 includes input register block 302, output register block 304, and handshaking logic block 306. These blocks 302, 304, and 306 implement an interface register map corresponding to interface register map 206 of FIG. 2.

Input register block 302 includes input data register circuitry 312 for receiving input data from sampling input line 311. The input data is stored in register circuitry 312 and provided to hardware block 308 as appropriate.

Input register block 302 includes parameter register circuitries 316a, 316b, 316c and 316d for receiving configuration parameters through parameter input line 315. These configuration parameters may correspond to gain coefficients, filtering coefficients, or any appropriate parameter. Input register block 302 may include channel register circuitry 318 configured for receiving from channel line 310 an identifier of the channel being input or processed during a given processing cycle. Selection circuitry 314 determines which of parameter register circuitries 316a, 316b, 316c, or 316d provides configuration parameter data to hardware block 306. This determination may be based on the channel identifier from channel input line 310 and may allow quick switching between multiple channels.

In the illustrative implementation of FIG. 3, selection circuitry 314 includes multiplexer circuitry with a selection input set to the channel identifier from the channel input line 310. By selecting from different parameter storage circuitries, the speed of switching between channels may be substantially increased in multi-channel implementations.

Output register block 304 includes decoder circuitry 354 for selecting which of output register circuitries 356a, 356b, 356c, or 356d receives output data from hardware block 306. To do this, decoder circuitry 354 is controlled by channel output line 370. This signal 370 may be provided directly to the decoder circuitry 354 or it may be stored in a dedicated channel register (not shown). Output data from data output line 352 is therefore directed to an appropriate one of the output registers depending on the channel the output data corresponds to. Output register block 304 may output data for all channels through a global output data line 358.

Although input data register circuitry 312 and channel register circuitry 318 are illustrated as single registers and although parameter register circuitries 316a, 316b, 316c and 316d correspond each to one channel, this is meant for the purposes of illustration not limitation. Other implementations can be used, such as sharing a different number of channels and a different number of registers per channel. Additionally, the memory used is not limited to any particular type or structure, and can be implemented in any number of ways, including DRAM, RAM, FIFO buffers, FILO buffers, etc. The storage mechanism may also take many forms, such as a database format, tables of software pointers, a linked list, a queue, a lookup table, etc. Similarly, although output register 304 has a single register per channel, this is meant for the purposes of illustration not limitation. Other implementations can be used, such as using a FIFO structure or any suitable storage structure and handling mechanism, without departing from the scope of this disclosure.

In some implementations, the generated interface is a slave interface. This may involve generating handshaking logic block 306 for connecting hardware block 306 to interface 350. Handshaking logic block 306 may provide a data-valid signal 321 to hardware block 306. Handshaking logic block 306 may receive a data-ready signal 322 from hardware block 306.

The data-ready signal 322, output from the hardware block indicates that the hardware block is ready to receive new data. Data-ready signal 322 may be asserted in response to the hardware block being ready to receive new data. When the hardware block is not ready to receive new data, data-ready signal 321 may be set to low.

The data-valid signal 321, output from the external source, e.g., processor, through interface 350 and input to the hardware block, indicates that the source has put valid data on the sampling input line 311 this cycle. The data-valid signal 321 may be a state signal that is high only in response to the input data being valid. If data is not valid on the input data line 311 during a particular cycle, data-valid signal 322 may be set to low during that cycle.

The handshaking logic block 306 controls movement of data so that data passes from the external source to the hardware block 308 only when the source has valid data to pass and when the hardware block 308 is ready to receive that data. In some implementations, in response to the handshaking logic block 306 determining that the data-valid signal 321 and data-ready signal 322 are both high, data on the input data line 311 is latched into the hardware block on the next rising edge.

It should be understood that the above implementation is meant for the purposes of illustration not limitation. For example, in some implementations, interface 350 may be a master interface and may not require handshaking logic.

Figure 4:
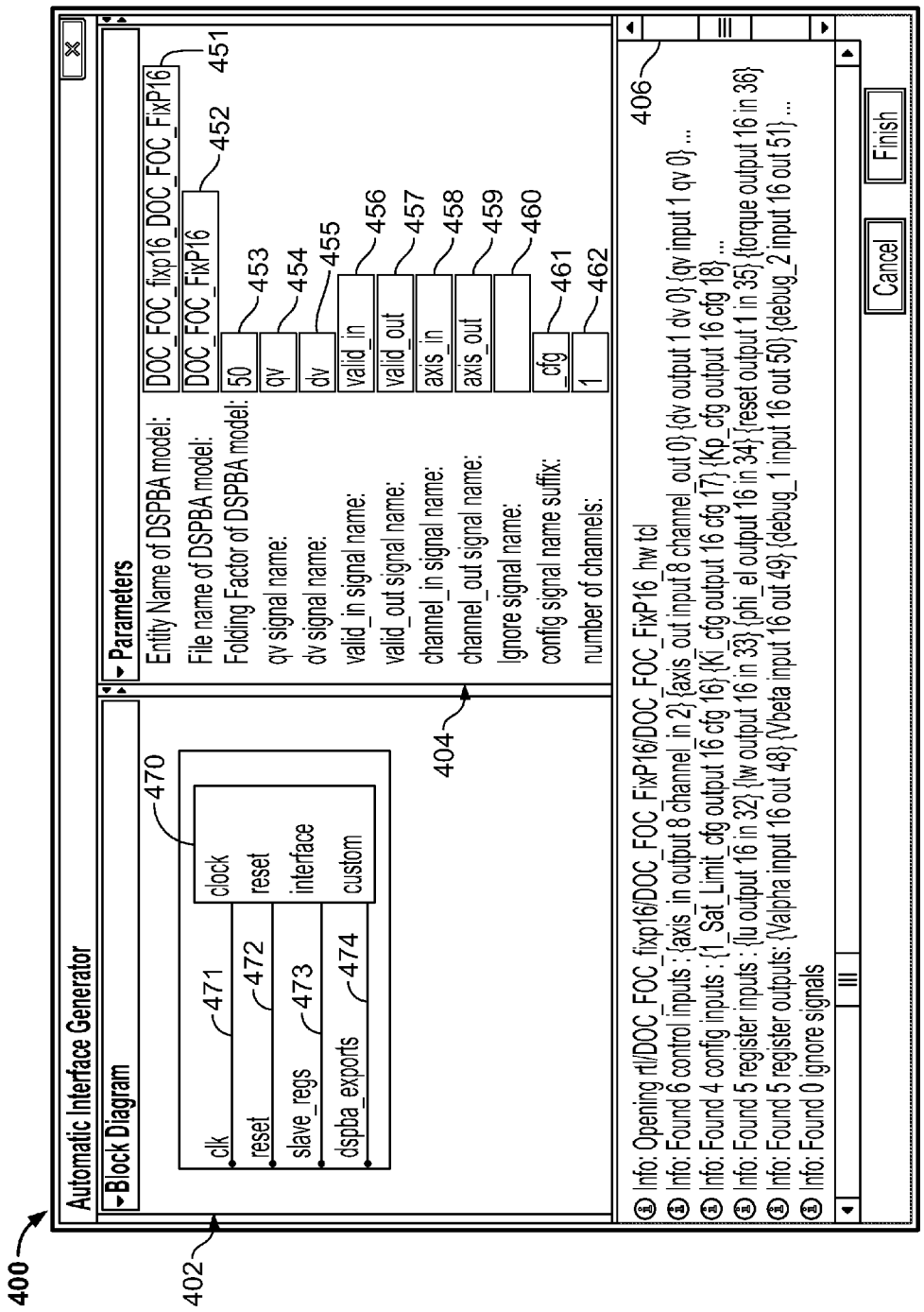
FIG. 4 illustrates a screenshot of an example user interface according to some embodiments.

FIG. 4 illustrates a screenshot of an example user interface 400 which may be used according to some embodiments, e.g., by the system in FIG. 1.

Illustrative interface 400 includes a diagram frame 402 that shows a description of the generated interface. For example, generated interface 470 includes clock signal 471, reset signal 472, interface conduit signals 473, and custom conduit signals 474. Interface conduit signals 473 may be similar to interface conduit signals 208 of FIG. 2. Custom conduit signals 474 may be similar to custom conduit signals 214 of FIG. 2.

Illustrative interface 400 includes a user input frame 404. The user may define, through user input frame 404, various parameters of the hardware component for which the interface is being generated. Exemplary parameters include an entity name 451, a file name 452, and a folding factor 453 for describing the hardware block for which the interface is being generated. Other exemplary parameters include an output data valid "qv signal" name 454, an input data valid "dv signal" name 455, a "valid in" signal name 456, a "valid out" signal name 457, a "channel in" signal name 458, a "channel out" signal name 459, an "ignore" signal name 460, a "config" signal name suffix 461, and number of channels 462. These parameters may be specific to the hardware block being used and/or to the interface being generated. Each of parameter values 451 through 462 may be populated with a default value (including the null value) and/or may be modified by the user as desired.

Illustrative interface 400 includes a console frame 406 for displaying progress information about the automatic interface generation, e.g., as described in process 500 above. In the illustrated example, the name and location of the file being parsed is displayed, as well as the names and numbers of control input signals, configuration input signals, register inputs, register outputs, and ignore signals (e.g., custom signals that are exported outside of the register map).

The above user graphical interface 400 is exemplary and not limiting. For example, the layout of the various frames 400, 402, 404, and 406 is not limited to what is illustrated in FIG. 4 and may include other configurations and functionality, including but not limited to drag-and-drop, progress bar, and search.

Figure 6:
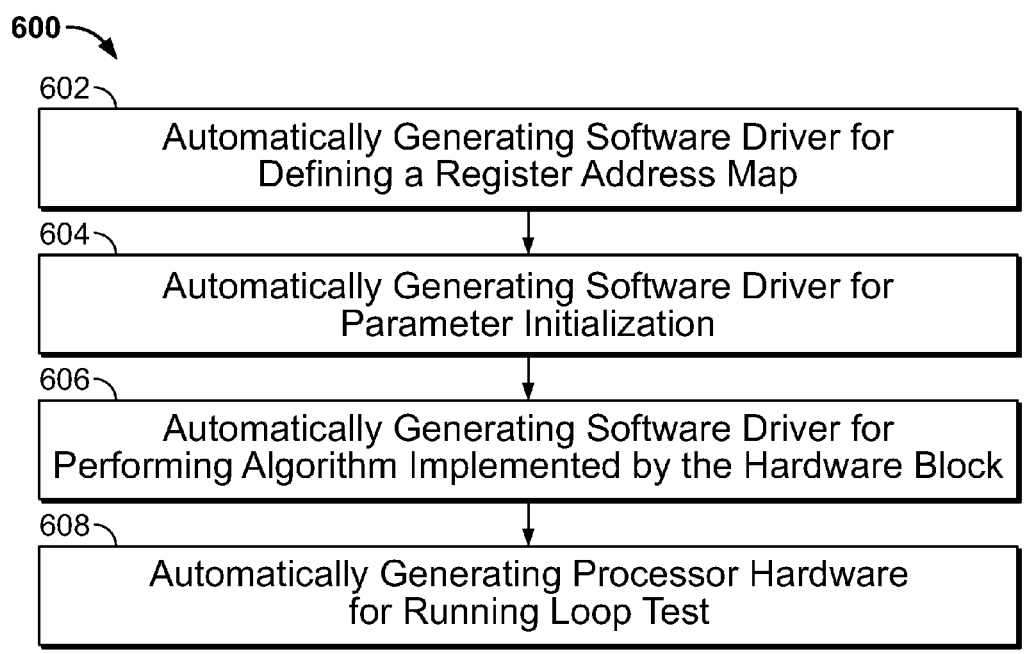
FIG. 6 shows a flowchart of a process for generating software and/or hardware components for the interface in accordance with some embodiments.

FIG. 6 shows a flowchart of a process 600 for generating software and/or hardware components for the interface in accordance with some embodiments. Process 600 may be implemented as part of step 506 of FIG. 5. Process 600 may be performed by automatic interface generator 150 of FIG. 1.

At 602, a first software driver is automatically generated for defining a register address map corresponding to an interface register map such as register map 204 of FIG. 2. The address map may identify locations of the various registers such as parameter registers 316a through 316d of FIG. 3, channel register 318 of FIG. 3, input register 312, and output registers 356a through 356d of FIG. 3. The address map may also identify the location of data-ready and data-valid signals to be used by handshaking logic, such as the location of a START bit value that is set to '1' to start the calculation, and the location of a BUSY bit value that is set to '0' to indicate that the calculation is finished.

An exemplary and non limiting register address map that is byte-addressed is illustrated below. It should be understood that this is for the purposes of illustration not limitation, and that any other type of addressing, naming, and memory circuitries may be used without departing from the scope of this disclosure.

```
//////////////////////////////////////////////////
// Defines for Register address locations
//////////////////////////////////////////////////
// DSPBA_START - Write a 1 to this location to start the calculation
// DSPBA_BUSY - When a 0 is read from this location the calculation has finished
// <NAME>_CFG are configuration registers that are used to store per channel parameters
// <NAME>_CHANNEL is the channel registers. Write the channel number to this register before accessing _CFG registers or starting a calculation
// <NAME>_INPUT are data input registers that are loaded with input data before a calculation is started
// <NAME>_OUTPUT are result registers which are read after a calculation is complete
//////////////////////////////////////////////////
#define DSPBA_START            4
#define DSPBA_BUSY             0
#define I_Sat_Limit_cfg_CFG    64
#define Iu_INPUT               128
#define Vbeta_OUTPUT           196
#define axis_in_CHANNEL        8
```

At 604, a second software driver for parameter initialization is automatically generated. The parameter initialization software driver may include instructions for loading channel information from channel registers similar to channel register 318 of FIG. 3. The parameter initialization software driver may also include instructions for loading, from parameter registers similar to parameter registers 316a through 316d of FIG. 3, configuration parameters for configuring the hardware block. Examples of configuration parameters include but are not limited to control gain parameters, various options, or any other type of initialization data for configuring the hardware block.

At 606, a third software driver for performing the algorithm implemented by the hardware block is automatically generated. The algorithm performance software driver may include instructions for loading input data from input registers similar to input register 312 of FIG. 3. The algorithm performance software driver may also include instructions for performing handshaking logic, such as instructions for updating the value of the START bit in response to which the hardware block starts an $i^{th}$ computation. The algorithm performance software driver may also include instructions for waiting until the hardware block finishes the $i^{th}$ computation. This may be done by implementing a loop that waits for the BUSY bit value to indicate that the hardware block is finished with the $i^{th}$ computation. The algorithm performance software driver may also include instructions for reading output data from output registers similar to output registers 356a through 356d of FIG. 3 in response determining that the $i^{th}$ computation is finished.

At 608, processor hardware is automatically generated for running a loop test. The loop test may iterate over input data samples, such as ones provided in a system level EDA tool, e.g., Simulink. In each iteration, the loop test may load both configuration data and sample input data and have the hardware block run the algorithm on the loaded sample input data. The loop test may then read the output data generated from the hardware block and compare the output data to stored, expected results. For example, the loop test may verify the output data against golden reference results. In this way, running the test is automated in hardware and the loop test can replay simulation vectors in hardware, which maintains compatibility with and transparency to the system level EDA tool.

The systems and methods described herein may enhance the user experience by building a native streaming interface for components used in system level EDA tools and/or by connecting a streaming interface to a memory mapped interface. In some embodiments, the systems and methods described here automatically build processor interfaces for an HDL representation of a hardware block with a streaming interface to allow direct connection to the processor, including software functions for the processor to interface with the generated streaming interface.

The systems and methods described herein may increase ease of use of system level EDA tools by automatically building an interface and handshaking logic, by automatically adapting to port lists provided by any HDL-generating tool (such as, but not limited to, DSP Builder), by automatically adapting to changes in those port lists, and/or by maintaining transparency to the system level EDA simulation tool. For example, the systems and methods described herein may free the user from having to add extra interface blocks or annotate the system level simulation model. This may be achieved without affecting the simulation behavior expected by the user. In one exemplary use case, the systems and methods described herein automatically generate a processor interface and handshaking logic for a hardware block, where the interface and logic are transparent to the Simulink simulation model. In this way, the user still experiences the Simulink simulation behavior but does not have to annotate the Simulink simulation model or create interface blocks inside the system level EDA tool. This increases ease of use, and may also enhance robustness and efficiency by encouraging designers to reuse existing hardware components.

The systems and methods described herein may allow easier software and/or hardware partitioning of models in Simulink and other tools as the interface is automatically built to match and/or detect any port changes. For example, the generated register map definitions and/or functions may efficiently achieve the hardware and software integration tasks.

The systems and methods described herein may enhance software integration by automatically creating software drivers. The systems and methods described here may integrate well with automatic hardware tool flows, for example, by allowing automated flows for capturing Simulink simulation vectors and replaying the simulation vectors in hardware via a processor to verify the hardware. The systems and methods described herein may integrate well with automatic software generation tool flows such as Simulink Coder® or Real-Time Workshop®.

The structures described above may be generated in programmable devices or in fixed logic, in which case the sizes of the various computational components may be fixed to a particular application. Alternatively, the fixed logic circuitry could allow for limited parameterization.

It will be understood that the foregoing is only illustrative, and that various modifications can be made by those skilled in the art without departing from the scope of the disclosure. For example, while certain components of this disclosure have been described as implemented in hardware and others in software, other configurations may be possible. One skilled in the art will appreciate that the present disclosure can be practiced by other than the described embodiments, which are presented for purposes of illustration and not of limitation. It will be understood that the above steps of processes 500 and 600 may be executed or performed in any order or sequence not limited to the order and sequence shown and described in the figure and that some of the steps may be omitted without departing from the scope of this disclosure. Also, some of the above steps of processes 500 and 600 may be executed or performed substantially simultaneously where appropriate or in parallel to reduce latency and processing times.

What is claimed is:

1. A method for connecting a hardware block to another component, the method comprising:
    parsing a description file of the hardware block to extract a plurality of interface signals;
    automatically building, in hardware, a register map based on the extracted interface signals, wherein the register map comprises:
        an input register configured for supplying an input signal to the hardware block, the input signal matching a first interface signal from the plurality of interface signals; and
        an output register configured for receiving an output signal from the hardware block, the output signal matching a second interface signal from the plurality of interface signals; and
    automatically generating a software driver for interfacing with the automatically built register map according to a target interface, the target interface configured for connecting the hardware block to the another component.

2. The method of claim 1, further comprising filtering the extracted interface signals into an input category and an output category.

3. The method of claim 1, wherein the another component is one of a processor and a memory component.

4. The method of claim 1, wherein said generating comprises generating at least one of a processor-readable address map and a software function for interfacing with the automatically built register map.

5. The method of claim 1, further comprising automatically adjusting a list of ports of the hardware block.

6. The method for encoding data of claim 1, further comprising creating handshaking logic configured for:
    indicating that the hardware block should start a computation; and
    indicating that the hardware block has ended the computation.

7. The method of claim 1, wherein the hardware block is configured to process first and second input data for first and second channels and wherein the register map comprises a first parameter register circuitry corresponding to the first channel and a second parameter register circuitry corresponding to the second channel.

8. The method of claim 1, wherein the target interface is a streaming interface.

9. A system for connecting a hardware block to another component, the system configured for:
    parsing a description file of the hardware block to extract a plurality of interface signals;
    automatically building, in hardware, a register map based on the extracted interface signals, wherein the register map comprises:
        an input register configured for supplying an input signal to the hardware block, the input signal matching a first interface signal from the plurality of interface signals; and
        an output register configured for receiving an output signal from the hardware block, the output signal matching a second interface signal from the plurality of interface signals; and
    automatically generating a software driver for interfacing with the automatically built register map according to a target interface, the target interface configured for connecting the hardware block to the another component.

10. The system of claim 9, further configured for filtering the extracted interface signals into an input category and an output category.

11. The method of claim 9, wherein the another component is one of a processor and a memory component.

12. The system of claim 9, further configured for generating at least one of a processor-readable address map and a software function for interfacing with the automatically built register map.

13. The system of claim 9, further configured for automatically adjusting a list of ports of the hardware block.

14. The system of claim 9, further configured for creating handshaking logic for:
    indicating that the hardware block should start a computation; and
    indicating that the hardware block has ended the computation.

15. The system of claim 9, wherein the hardware block is configured to process first and second input data for first and second channels and wherein the register map comprises a first parameter register circuitry corresponding to the first channel and a second parameter register circuitry corresponding to the second channel.

16. The system of claim 9, wherein the target interface is a streaming interface.

17. A register map for connecting a hardware block to another component, the register map comprising:
    an input register automatically configured in hardware for supplying an input signal to the hardware block, the input signal matching a first interface signal from a plurality of interface signals, wherein the plurality of interface signals is extracted from parsing a description file of the hardware block; and
    an output register automatically configured in hardware for receiving an output signal from the hardware block, the output signal matching a second interface signal from the plurality of interface signals, wherein the register map interfaces with a target interface using an automatically generated software driver, wherein the target interface is configured for connecting the hardware block to the another component.

18. The register map of claim 17, wherein the another component is one of a processor and a memory component.

19. The register map of claim 17, wherein the target interface is a streaming interface.

20. The register map of claim 17, wherein the software driver comprises at least one of a processor-readable address map and a software function.

\* \* \* \* \*